(12) United States Patent
Wikstroem et al.

(10) Patent No.: US 11,824,091 B2
(45) Date of Patent: Nov. 21, 2023

(54) INTEGRATED GATE-COMMUTATED THYRISTOR (IGCT)

(71) Applicant: Hitachi Energy Switzerland AG, Baden (CH)

(72) Inventors: Tobias Wikstroem, Egliswil (CH); Umamaheswara Vemulapati, Windisch (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/802,312

(22) PCT Filed: Feb. 22, 2021

(86) PCT No.: PCT/EP2021/054324
§ 371 (c)(1),
(2) Date: Aug. 25, 2022

(87) PCT Pub. No.: WO2021/170537
PCT Pub. Date: Sep. 2, 2021

(65) Prior Publication Data
US 2023/0111333 A1    Apr. 13, 2023

(30) Foreign Application Priority Data
Feb. 25, 2020    (EP) ..................................... 20159223

(51) Int. Cl.
*H01L 29/08*    (2006.01)
*H01L 29/10*    (2006.01)
(Continued)

(52) U.S. Cl.
CPC ........ *H01L 29/0839* (2013.01); *H01L 29/102* (2013.01); *H01L 29/45* (2013.01); *H01L 29/66363* (2013.01)

(58) Field of Classification Search
CPC ............. H01L 29/66363; H01L 29/744; H01L 29/0839; H01L 29/102; H01L 29/45; H01L 29/0692
See application file for complete search history.

(56) References Cited

U.S. PATENT DOCUMENTS

| | | |
|---|---|---|
| 4,542,398 A | 9/1985 | Yatsuo et al. |
| 4,843,449 A | 6/1989 | Jaecklin et al. |

(Continued)

FOREIGN PATENT DOCUMENTS

| | | |
|---|---|---|
| CN | 108899358 A | 11/2018 |
| JP | S56131955 A | 10/1981 |

(Continued)

*Primary Examiner* — Wasiul Haider
(74) *Attorney, Agent, or Firm* — Slater Matsil, LLP

(57) ABSTRACT

An integrated gate-commutated thyristor (IGCT) includes a semiconductor wafer having a first main side and a second main side opposite to the first main side and a plurality of first type thyristor cells and second type thyristor cells. The cathode electrode of the first type thyristor cells forms an ohmic contact with the cathode region and the cathode electrode of the second type thyristor cells is insulated from the cathode region. A predefined percentage of second type thyristor cells of the overall amount of first type thyristor cells and second type thyristor cells in a segment ring is greater than 0% and less than or equal to 75%.

20 Claims, 3 Drawing Sheets

(51) Int. Cl.
*H01L 29/45* (2006.01)
*H01L 29/66* (2006.01)

(56) References Cited

U.S. PATENT DOCUMENTS

| | | |
|---|---|---|
| 2016/0284708 A1 | 9/2016 | Lophitis et al. |
| 2018/0204913 A1* | 7/2018 | Arnold ............... H01L 29/0696 |
| 2021/0257485 A1 | 8/2021 | Li |

FOREIGN PATENT DOCUMENTS

| | | |
|---|---|---|
| JP | S61274362 A | 12/1986 |
| JP | H01198074 A | 8/1989 |
| JP | H11145448 A | 5/1999 |
| JP | 2016181691 A | 10/2016 |
| JP | 2018530916 A | 10/2018 |
| WO | 2011076613 A1 | 6/2011 |

* cited by examiner

INTEGRATED GATE-COMMUTATED THYRISTOR (IGCT)

CROSS-REFERENCE TO RELATED APPLICATIONS

This application is a national stage application of International Application No. PCT/EP2021/054324, filed on Feb. 22, 2021, which claims priority to European Patent Application No. 20159223.5, filed on Feb. 25, 2020, which applications are hereby incorporated herein by reference.

TECHNICAL FIELD

The invention relates to the field of power semiconductor devices. In particular embodiments, it relates to an integrated gate-commutated thyristor (IGCT) and a method of manufacturing an integrated gate-commutated thyristor (IGCT).

BACKGROUND

The integrated gate-commutated thyristor (IGCT) has been established as the device of choice for many high power applications due to its thyristor-like conduction, transistor-like turn-off and hermetic press-pack design.

A prior art integrated gate commutated thyristor (IGCT) structure is shown in FIG. 1. The device 1 comprises a first main side 2, e.g. a cathode side, and a second main side 3, e.g. an anode side, which is arranged opposite to the first main side 2. It may be e.g. constructed as a four-layer pnpn structure with layers of different conductivity types. The four-layer structure defines an inner structure of a thyristor, which can be turned-off via a gate electrode 8. The layers are arranged between a cathode electrode 9 on the first main side 2 and an anode electrode 10 on the second main side 3 in the following order:
- An n doped cathode layer 4 with a central area, which is surrounded by a lateral edge, which cathode layer is in direct electrical contact to the cathode electrode 9,
- A p doped base layer 5,
- An (n−) doped drift layer 6, wherein the drift layer 6 has a lower doping concentration than the cathode layer 4,
- An n doped buffer layer 13, which has a higher doping concentration than the drift layer 6,
- A p doped anode layer 7, which is in electrical contact to the anode electrode 10.

The gate electrode 8 is arranged on the first main side 2 lateral to the cathode electrode 9 and the gate electrode 8 is in electrical contact to the base layer 5, but electrically separated from the cathode electrode 9.

During turn-off, the device gate voltage is negatively biased and most holes are attracted towards the gate electrode 8. During high stress such as high voltage and high current turn-off switching, the device enters dynamic avalanche whereas the peak electric field is distributed uniformly in the active region along the whole main blocking junction between the cathode layer 4 and the base layer 5. The avalanche-generated holes follow the path towards the gate terminal including the regions directly positioned below the (n++) cathode layer 4. The width of the cathode layer 4 is typically larger than 100 μm depending on the design.

EP 2 517 249 A1 discloses an integrated gate commutated power thyristor with high latch-up current during turn-off for increased safe operating area performance by providing a resistance reduction layer in which the resistance at the junction between the lateral edge of the cathode layer and the base layer is reduced and wherein the resistance reduction layer is separated from the gate electrode.

US 2018/0204913 A1 discloses a flat gate commutated thyristor comprising a plurality of gate commutated thyristor cells comprising a gate electrode which is arranged lateral to the cathode regions and which is separated from the cathode regions by a base layer respectively. The IGCT cells are arranged in concentric rings around the center of the device.

JP H01198074 A discloses a gate turn-off thyristor (GTO), with a split emitter and a gate electrode 2 formed on the Pa layer provided with a step, and a cathode electrode. There is furthermore disclosed a window opening formed on an insulating film 4 for forming a gate electrode on the PB layer and a cathode electrode on the No layer. A SIO2-film is applied to the portion where the window opening is formed to form a coating film. A cathode electrode plate is arranged on the cathode electrode, and a pressure welding structure type GTO is completed. In the GTO having the beforementioned structure, the cathode electrode is formed with a defective split emitter, and the cathode electrode also comes into contact with the cathode electrode plate, but the insulating film is directly under the sword electrode.

In general, IGCT devices do not show a linear relationship between the device area and the maximal controllable current, due to the unavoidable integral increase in the gate circuit when the device area increases. Common approximation is that the controllable current scales linearly with the device diameter, or the square-root of the device area. For very large devices (>70 mm in diameter) this effect may become limiting in operation, because most other parameters scale linearly with the device area. For example, on-state losses and thermal resistance both scale down linearly with device area and would facilitate a linear increase of the current.

An IGCT segment layout design is shown in FIG. 2. The gate contact (not shown) is located outside of ring 10. The, e.g. cigar-shaped, cathode electrodes of the GCT segments are arranged next to each other in concentric rings and the gate metallization is distributed between the segments. The exemplary mentioned cigar-shape in this context may be a cylinder shape with tapered end pieces on each of the two face surfaces of the cylinder.

A GCT segment represents the thyristor part of an IGCT, and hence it has e.g. an npnp vertical structure as it is shown as an example e.g. by the IGCT shown in FIG. 1 comprising a cathode region (4) of a first conductive type, e.g. n+-type, a base layer (5) of a second conductivity type, e.g. p-type, a drift layer (6) of the first conductivity type, e.g. $n^-$ type, and an anode layer (7) of the second conductivity type, e.g. p+-type. The segments are surrounded by gate metal which is connected to the thyristor's base, e.g. p-base, and turns off safely when the gate has collected all of the whole current that would otherwise cause electron emission from the e.g. n+-doped cathode. The time needed to re-route the current from the segment to the gate depends on the segment current, the gate voltage and the gate circuit impedance. As already mentioned, the impedance varies over the GCT wafer due to the layout. Hence, segments with low impedance, e.g. segments close to the gate contact, turn off faster than segments far from the gate contact that are connected through a large impedance.

The mismatch grows with increasing device size and for large wafers, the controllable current may be the limiting parameter in how much power can be converted.

The ratio of segment area to device area is referred to as the "segment density". Observing only a part of the device, the segment density also has a definition for that smaller part. Hence, the segment density can be regarded as a function of the location on the device surface, hereafter referenced as the local segment density.

A number of electrical and physical aspects benefit from maximizing the segment density, as e.g. the thermal transfer between wafer and the next contact, e.g. a Molybdenum disc.

The significance of lower on-state voltage and lower thermal impedance is trivial. In contrast, the significance of a large contact force is not. Increasing the contact force improves (lowers) the thermal and electrical impedances in a pressurized contact system of dry interfaces. Additionally, it makes the system less sensitive to morphing contact surfaces (e.g. corrosion, wear, fretting, etc.) that pose potential reliability threats over extended operation time. The upper limit of contact force is given by the yield strength of the materials in the system. The contact force causes a compressive tension that is maximal at the cathode segments, where the supporting contact area is smallest. If the yield threshold is exceeded, the segment metallization creeps and could cause the device to fail. Because of the softness of the copper pole-pieces, it is desirable to keep the local segment density constant over the device surface. Hence, in addition to benefiting from maximized segment density, the contact force requires a reasonable constant local segment density. The same logic, albeit somewhat twisted, applies to the thermal impedance. If the local segment density varies over the device surface, so does the local thermal impedance. Assuming that the power loss dissipation is independent of the segment density, a varying local segment density promotes the formation of hot-spots to areas where the local segment density is low. For this reason cooling, too, benefits from a roughly uniform local segment density over the device. Increasing the segment density decreases the area available for gate metallization between the segments. Less area for gate metallization leads to increased gate circuit impedance and ultimately to lower current controllability or even to direct thermal over-load of the gate metal. This is the disadvantage of a maximized segment density in a design.

SUMMARY

As explained above, the segment density is a trade-off between revealing entities. Embodiments of the invention can provide an application optimized segment layout.

A first embodiment provides an integrated gate-commutated thyristor (IGCT). A semiconductor wafer has a first main side and a second main side opposite to the first main side. A plurality of first type thyristor cells and second type thyristor cells are disposed in the wafer. Each of the plurality of first type thyristor cells and second type thyristor cells comprising in the order from the first main side to the second main side: a cathode region of a first conductivity type, a base layer of a second conductivity type different from the first conductivity type, a drift layer of the first conductivity type forming a second p-n junction with the base layer, and an anode layer of the second conductivity type separated from the base layer by the drift layer. The cathode region is formed as a well in the base layer to form a first p-n junction between the base layer and the cathode region.

The plurality of first type thyristor cells and second type thyristor cells comprise a gate electrode that is arranged lateral to the cathode region and forms an ohmic contact with the base layer. A cathode electrode is arranged on the first main side and an anode electrode is arranged on the second main side and forms an ohmic contact with the anode layer. The cathode electrodes of the plurality of first type thyristor cells form an ohmic contact with the cathode region. The cathode electrode of the plurality of second type thyristor cells are insulated from the cathode region. The cathode electrodes of the plurality of first type thyristor cells and second type thyristor cells are arranged in a segmented circular layout.

The segmented circular layout comprises multiple concentric segment rings increasing in diameter from the center of the segmented circular layout. The cathode electrodes of the plurality of first type thyristor cells and second type thyristor cells are radially oriented and are circularly arranged within the segment rings.

A predefined percentage of second type thyristor cells of the overall amount of first type thyristor cells and second type thyristor cells in a segment ring is larger than 0% and equal to or less than 75%, segmented circular layout is configured according one of the following: for the concentric segment rings the predefined percentage decreases with increasing diameter or for the concentric segment rings the predefined percentage decreases monotonically with increasing diameter. The segmented circular layout comprises at least three concentric segment rings and wherein the predefined percentage is not equal for each of the concentric segment rings and forms a maximum somewhere between the innermost and the outermost concentric segment ring.

In certain embodiments, the predefined percentage decreases for the concentric segment rings with increasing diameter.

In certain embodiments, the predefined percentage decreases monotonically for the concentric segment rings with increasing diameter.

In certain embodiments, the segmented circular layout comprises at least three concentric segment rings and the predefined percentage is not equal for each of the concentric segment rings and forms a maximum somewhere between the innermost and the outermost concentric segment ring.

In certain embodiments, the predefined percentage within each of the concentric segment rings is equally distributed in a circular direction.

In certain embodiments, a gate contact is placed radially outside of the concentric segment rings.

In certain embodiments, a gate contact is placed in the center of the concentric segment rings.

In certain embodiments, a gate contact is placed radially outside of the concentric segment rings and the predefined percentage increases for the concentric segment rings with increasing diameter to a maximum amount and then the predefined percentage decreases for the concentric segment rings with increasing diameter.

In certain embodiments, the cathode electrodes of the plurality of first type thyristor cells and second type thyristor cells have a cylinder shape with tapered end pieces on each of the two face surfaces of the cylinder.

A method of manufacturing an integrated gate-commutated thyristor (IGCT) is also disclosed. The method comprises providing a wafer having a first main side, forming a gate dielectric on the first main side of the wafer, structuring the gate dielectric to form the ohmic contacts of the plurality of gate electrode with the base layer and to form the ohmic contacts of the cathode electrode of the plurality of first type thyristors with the cathode region. The step of structuring the gate dielectric comprises providing a mask layer, structuring the mask layer and etching the gate dielectric, wherein the cathode electrodes of the second type thyristor cells are obtained by leaving gate dielectric for the cathode electrodes of the second type thyristor cells unetched.

BRIEF DESCRIPTION OF THE DRAWINGS

The subject matter of embodiments the invention will be explained in more detail in the following detailed description with reference to the attached drawings, in which.

The reference signs used in the figures are summarized in the list of reference signs at the end of this specification. The described embodiments are meant as examples and shall not confine the invention. The invention is solely defined by the claims.

DETAILED DESCRIPTION OF ILLUSTRATIVE EMBODIMENTS

Figure 1:
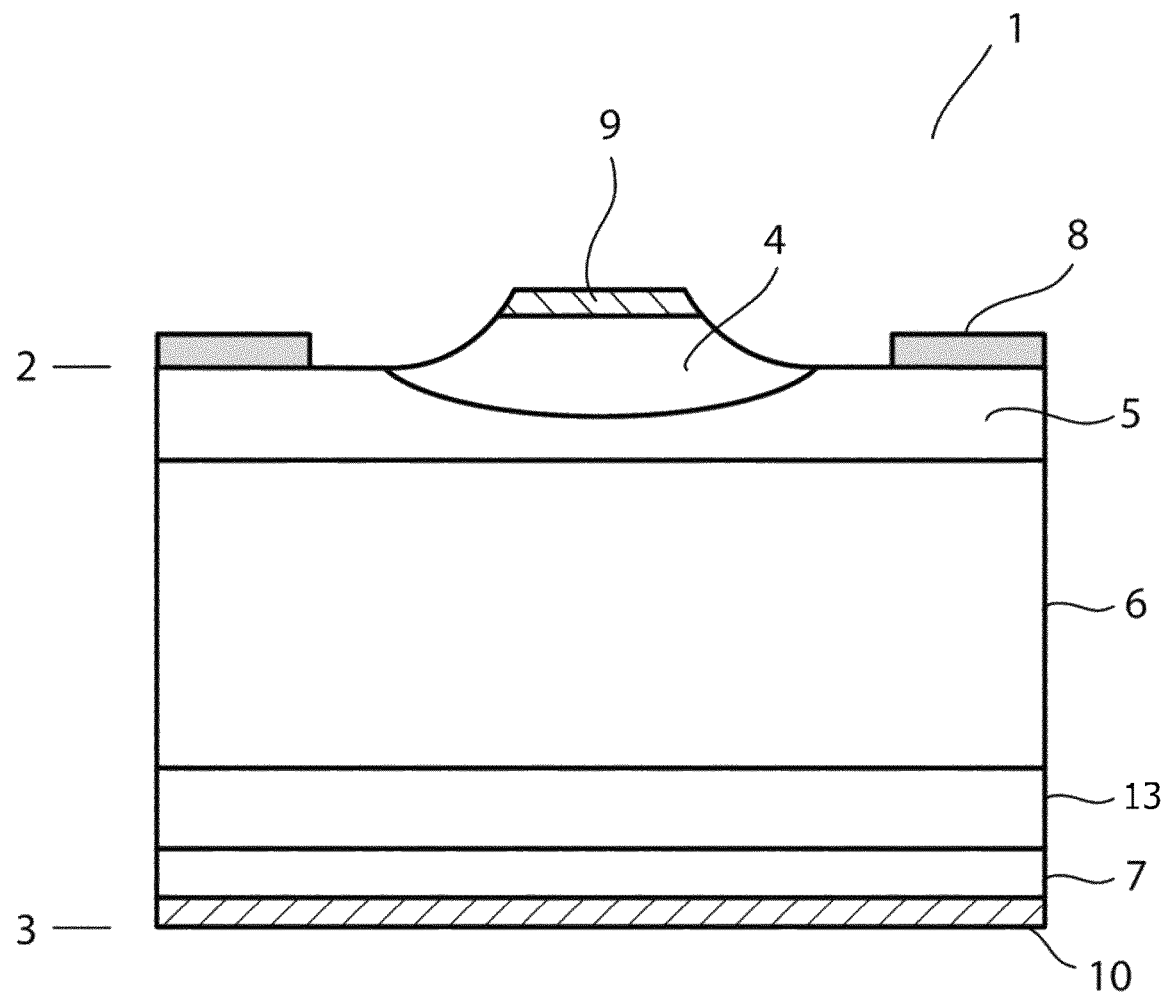
FIG. 1 shows an integrated gate-commutated thyristor (IGCT) according to prior art.

FIG. 1 shows an example of a power semiconductor device in form of an integrated gate-commutated thyristor 1 (IGCT) with a four-layer structure (pnpn or npnp). The IGCT 1 comprises a semiconductor wafer having a first main side 2 and a second main side 3 opposite to the first main side 2.

The IGCT 1 comprises a plurality of thyristor cells. The plurality of thyristor cells comprises thyristor cells of a first type and a second type. Each of the plurality of first type thyristor cells and a second type thyristor cells comprises in the order from the main side 2 to the second main side 3: a cathode region 4 of a first conductivity type, e.g. n+ type, a base layer 5 of a second conductivity type, e.g. p-type, different from the first conductivity type, wherein the cathode region 4 is formed as a well in the base layer 5 to form a first p-n-junction between the base layer 5 and the cathode region 4, a drift layer 6 of the first conductivity type, e.g. n⁻-type, forming a second p-n-junction with the base layer 5, and an anode layer 7 of the second conductivity type, e.g. p+-type, separated from the base layer 5 by the drift layer 6.

Figure 3A:
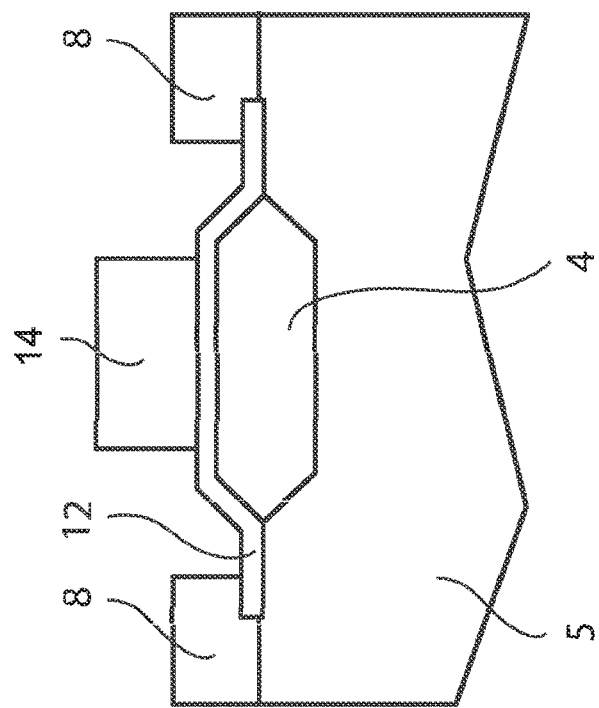
FIG. 3A shows an active segment of an IGCT according to an embodiment of the present invention.
Figure 3B:
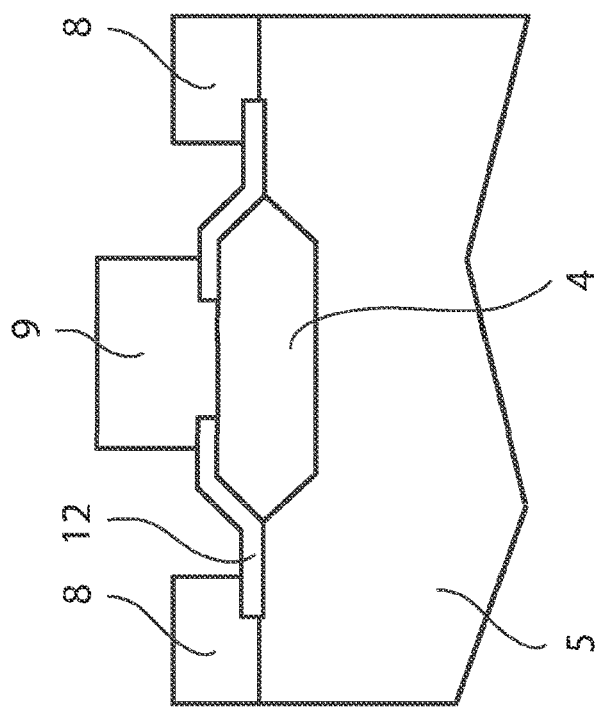
FIG. 3B shows an inactive segment of an IGCT according to an embodiment of the present invention.

Each of the plurality of first type thyristor cells and a second type thyristor cells comprises a gate electrode 8 which is arranged lateral to the cathode region 4 and forms an ohmic contact with the base layer 5, and a cathode electrode 9, 14 arranged on the first main side 2. FIG. 3A shows that the cathode electrodes 9 of the plurality of first type thyristor cells form an ohmic contact with the cathode region 4, and FIG. 3B shows that the cathode electrodes 14 of the plurality of second type thyristor cells are insulated from the cathode region 4. A gate contact may electrically contact the gate electrodes 8.

Figure 2:
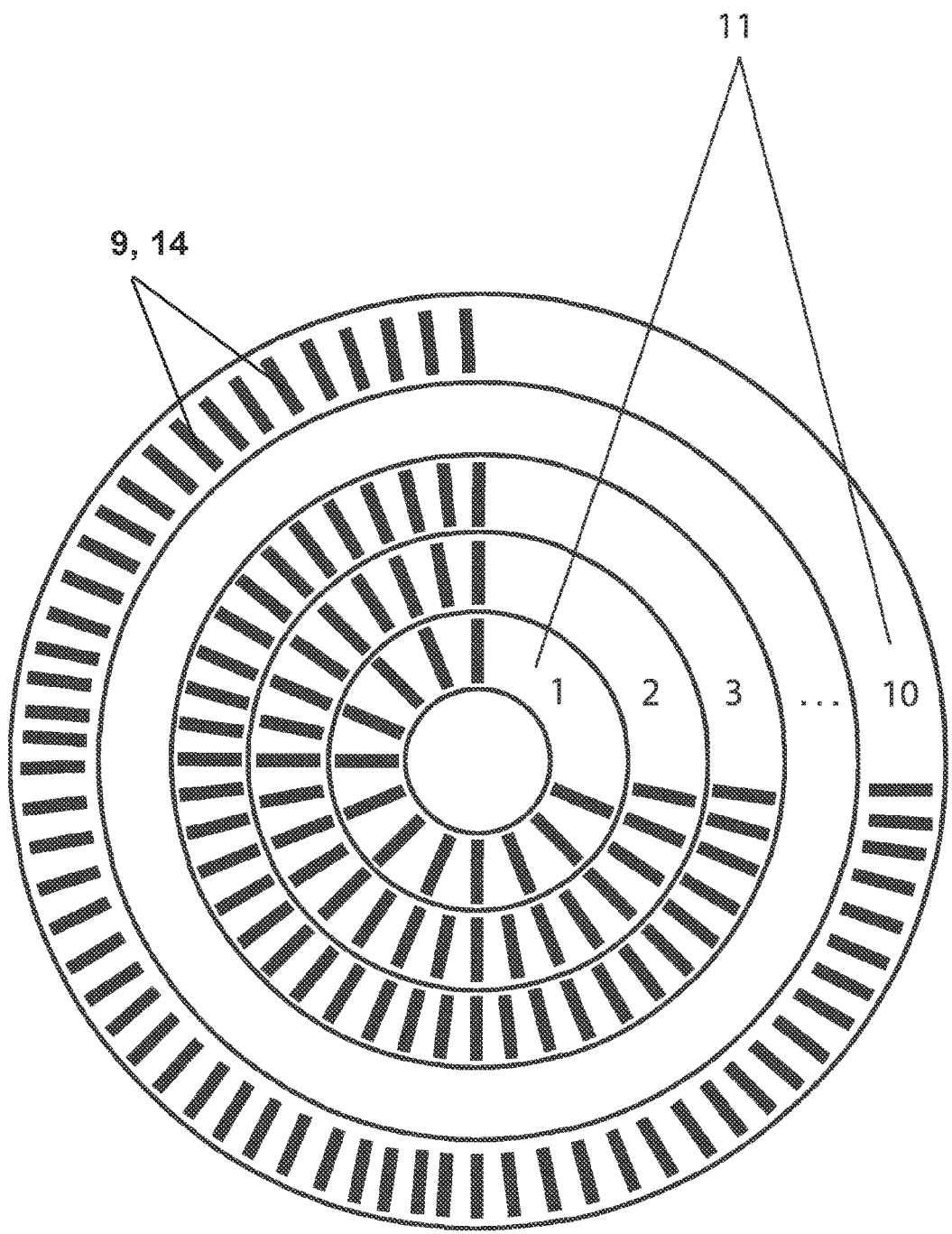
FIG. 2 shows an IGCT segment layout design according to an embodiment of the present invention.

The integrated gate-commutated thyristor 1 (IGCT) furthermore comprises an anode electrode 10 arranged on the second main side 3 and forming an ohmic contact with the anode layer 7. As shown in FIG. 2, the cathode electrodes 9, 14 of the plurality of first type thyristor cells and a second type thyristor cells are arranged in a segmented circular layout, wherein the segmented circular layout comprises multiple concentric segment rings 11 increasing in diameter from the center of the segmented circular layout and wherein the cathode electrodes 9 of the plurality of first type thyristor cells and a second type thyristor cells are radially oriented and are circularly arranged within the segment rings 11. In one embodiment, the cathode electrodes 9 may have a cylinder shape with tapered end pieces on each of the two face surfaces of the cylinder.

To achieve the above described desired trade-off between i) maximizing the segment density to lower the on-state voltage and the thermal impedance and ii) the avoiding of an increased gate circuit impedance due to the smaller area for gate metallization, the embodiment of the invention proposes to deactivate segments electrically, in order to locally relief the gate circuit of current. Deactivation retains the thermal and contact-force benefits of the design. A deactivated segment does not partake in current conduction. As a result, the current is shared between the remaining active segments, whose current increase somewhat. If segments located far away from the gate contact are deactivated, the current from that region is lowered and the current in regions closer to the gate contact is increased. This may lead to increased maximal controllable current, thanks to loading the low-impedance regions of the device more than the high-impedance. Due to the increased current density in the remaining segments, the on-state voltage also increases. However, if only a fraction of the segments is deactivated, the advantages may easily overrule the on-state disadvantage. Deactivation of segments therefore leads to a more uniform local segment density over the device which avoids hot spot formation due to inhomogeneous cooling as well as a uniform force sharing over the GCT surface, an increased current controllability and an increased on-state voltage.

The deactivation of segments can be defined by a deactivation ratio. The deactivation ratio for a segment ring 11 is defined as a ratio between the number of inactive segments and the total number of segments in a segment ring 11. The deactivation ratio is a predefined percentage of the second type thyristor cells in relation to the overall amount of first type thyristor cells and second type thyristor cells in a segment ring. Sensible deactivation ratios range between 3:4 (25% of the segments in a ring are active) to 0 (all the segments in a ring are active). The radial distribution of deactivation ratios is the progression of segment-specific ratios with ring number. Optimal choices for the distribution varies between different design options. In general, the physical separation between the gate contact and the segment ring 11 increases the deactivation ratio. According to an embodiment of the present invention for a predefined percentage of second type thyristor cells of the overall amount of first type thyristor cells and second type thyristor cells (inactive cells) in a segment ring, the predefined percentage is therefore larger than 0% (more than 0% of the segments in a ring are inactive) or equal to or less than 75% (75% or less of the segments in a ring are inactive).

As already mentioned above, in another embodiment, a predefined percentage of second type thyristor cells decreases for the concentric segment rings 11 with increasing diameter as shown by concentric rings 1 to 10 in FIG. 2. However, the area and segment density of the segment ring both increase the need for deactivation. The former increases with ring number, both because of the square dependency on the radius of the segment ring area (segment ring area=radius²·π), but also because segment rings tend to widen with increasing area. In another embodiment the segmented circular layout comprises at least three concentric segment rings 11 and the predefined percentage is not equal for each of the concentric segment rings 11 and forms a maximum somewhere between the innermost and the outermost concentric segment ring 11. In another embodiment, the predefined percentage within each of the concentric segment rings 11 is equally distributed in a circular direction.

In another embodiment, a gate contact electrically contacting the gate electrodes is placed radially outside of the concentric segment rings 11.

In another embodiment, a gate contact electrically contacting the gate electrodes is placed in the center of the concentric segment rings.

In another embodiment, where a gate contact electrically contacting the gate electrodes is placed radially outside of the concentric segment rings 11, the predefined percentage increases for the concentric segment rings 11 with increasing diameter to a maximum amount and then the predefined percentage decreases for the concentric segment rings with increasing diameter.

In another embodiment, the cathode electrodes (9) of the plurality of first type thyristor cells and second type thyristor cells have a cylinder shape with tapered end pieces on each of the two face surfaces of the cylinder.

It is another embodiment of the present invention, a method of manufacturing the integrated gate-commutated thyristor (IGCT) is provided. The method of manufacturing an IGCT, comprises providing a wafer having a first main side 2, forming a gate dielectric 12 on the first main side of the wafer, structuring the gate dielectric 12 to form the ohmic contacts of the plurality of gate electrodes 8 with the base layer 5 and to form the ohmic contacts of the cathode electrode 9 with the cathode region 4, wherein the step of structuring the gate dielectric 12 comprises the steps of providing a mask layer, structuring the mask layer and etching through the gate dielectric 12, wherein the cathode electrodes 9 of the second type thyristor cells are obtained by leaving gate dielectric 12 for the cathode electrodes 9 of the second type thyristor cells unetched.

As it is evident, e.g. from FIGS. 3A and 3B, depending on the design of the mask layer, the gate dielectric 12 is etched or not and therefore depending on the design of the mask layer, the cathode electrode 9, 14 contacts the cathode layer 4 or is insulated by the gate dielectric 12 from the cathode layer 4.

Depending on the desired application of the device and the according design of the mask layer therefore the predefined percentage of cathode electrodes 9, 14 may be determined without increasing the effort for manufacturing the integrated gate-commutated thyristor 1 according to an embodiment of the present invention.

LIST OF REFERENCE SIGNS

1 integrated gate-commutated thyristor (IGCT)
2 first main side
3 second main side
4 cathode region
5 base layer
6 drift layer
7 anode layer
8 gate electrode
9, 14 cathode electrode
10 anode electrode
11 concentric segment rings
12 gate dielectric
13 buffer layer

The invention claimed is:
1. An integrated gate-commutated thyristor (IGCT) comprising:
a semiconductor wafer having a first main side and a second main side opposite to the first main side;
a plurality of first type thyristor cells and second type thyristor cells, each of the plurality of first type thyristor cells and second type thyristor cells comprising in order from the first main side to the second main side:
a cathode region of a first conductivity type;
a base layer of a second conductivity type different from the first conductivity type, wherein the cathode region is formed as a well in the base layer to form a first p-n junction between the base layer and the cathode region;
a drift layer of the first conductivity type forming a second p-n junction with the base layer; and
an anode layer of the second conductivity type separated from the base layer by the drift layer;
wherein the plurality of first type thyristor cells and second type thyristor cells each further comprise:
a gate electrode arranged laterally with respect to the cathode region, the gate electrode forming an ohmic contact with the base layer;
a cathode electrode arranged on the first main side, the cathode electrodes of the plurality of first type thyristor cells forming an ohmic contact with the cathode region and the cathode electrodes of the plurality of second type thyristor cells being insulated from the cathode region; and
an anode electrode arranged on the second main side and forming an ohmic contact with the anode layer;
wherein the cathode electrodes of the plurality of first type thyristor cells and second type thyristor cells are arranged in a segmented circular layout;
wherein the segmented circular layout comprises multiple concentric segment rings increasing in diameter from the center of the segmented circular layout;
wherein the cathode electrodes of the plurality of first type thyristor cells and second type thyristor cells are radially oriented and are circularly arranged within the concentric segment rings;
wherein a predefined percentage of second type thyristor cells of the overall amount of first type thyristor cells and second type thyristor cells in a segment ring is greater than 0% and less than or equal to 75%; and
wherein the segmented circular layout is configured so that, for the concentric segment rings, the predefined percentage decreases with increasing diameter.

2. The IGCT according to claim 1, wherein the segmented circular layout is configured so that, for the concentric segment rings, the predefined percentage decreases monotonically with increasing diameter.

3. The IGCT according to claim 1, wherein the predefined percentage within each of the concentric segment rings is equally distributed in a circular direction.

4. The IGCT according to claim 1, further comprising a gate contact electrically contacting the gate electrodes, the gate contact being located radially outside of the concentric segment rings.

5. The IGCT according to claim 4, wherein the predefined percentage increases for the concentric segment rings with increasing diameter to a maximum amount and then the predefined percentage decreases for the concentric segment rings with increasing diameter.

6. The IGCT according to claim 1, further comprising a gate contact electrically contacting the gate electrodes, the gate contact being located in the center of the concentric segment rings.

7. An integrated gate-commutated thyristor (IGCT) comprising:

a semiconductor wafer having a first main side and a second main side opposite to the first main side;
a plurality of first type thyristor cells and second type thyristor cells, each of the plurality of first type thyristor cells and second type thyristor cells comprising in order from the first main side to the second main side:
a cathode region of a first conductivity type;
a base layer of a second conductivity type different from the first conductivity type, wherein the cathode region is formed as a well in the base layer to form a first p-n junction between the base layer and the cathode region;
a drift layer of the first conductivity type forming a second p-n junction with the base layer; and
an anode layer of the second conductivity type separated from the base layer by the drift layer;
wherein the plurality of first type thyristor cells and second type thyristor cells each further comprise:
a gate electrode arranged laterally with respect to the cathode region, the gate electrode forming an ohmic contact with the base layer;
a cathode electrode arranged on the first main side, the cathode electrodes of the plurality of first type thyristor cells forming an ohmic contact with the cathode region and the cathode electrodes of the plurality of second type thyristor cells being insulated from the cathode region; and
an anode electrode arranged on the second main side and forming an ohmic contact with the anode layer;
wherein the cathode electrodes of the plurality of first type thyristor cells and second type thyristor cells are arranged in a segmented circular layout;
wherein the segmented circular layout comprises multiple concentric segment rings increasing in diameter from the center of the segmented circular layout;
wherein the cathode electrodes of the plurality of first type thyristor cells and second type thyristor cells are radially oriented and are circularly arranged within the concentric segment rings;
wherein a predefined percentage of second type thyristor cells of the overall amount of first type thyristor cells and second type thyristor cells in a segment ring is greater than 0% and less than or equal to 75%;
wherein the segmented circular layout is configured so that, for the concentric segment rings, the predefined percentage decreases with increasing diameter;
wherein the segmented circular layout comprises at least three concentric segment rings; and
wherein the predefined percentage is not equal for each of the concentric segment rings and forms a maximum somewhere between the innermost and the outermost concentric segment ring.

8. The IGCT according to claim 7, wherein the segmented circular layout is configured so that, for the concentric segment rings, the predefined percentage decreases monotonically with increasing diameter.

9. The IGCT according to claim 7, wherein the predefined percentage within each of the concentric segment rings is equally distributed in a circular direction.

10. The IGCT according to claim 7, further comprising a gate contact electrically contacting the gate electrodes, the gate contact being located radially outside of the concentric segment rings.

11. The IGCT according to claim 10, wherein the predefined percentage increases for the concentric segment rings with increasing diameter to a maximum amount and then the predefined percentage decreases for the concentric segment rings with increasing diameter.

12. The IGCT according to claim 7, further comprising a gate contact electrically contacting the gate electrodes, the gate contact being located in the center of the concentric segment rings.

13. A method of manufacturing an integrated gate-commutated thyristor (IGCT),
forming a plurality of semiconductor regions in a semiconductor wafer for first type thyristor cells and second type thyristor cells, the semiconductor regions comprising in order from a first main side of the semiconductor wafer to a second main side of the semiconductor wafer:
a cathode region of a first conductivity type;
a base layer of a second conductivity type different from the first conductivity type, wherein the cathode region is formed as a well in the base layer to form a first p-n junction between the base layer and the cathode region;
a drift layer of the first conductivity type forming a second p-n junction with the base layer; and
an anode layer of the second conductivity type separated from the base layer by the drift layer;
forming a gate electrode for each thyristor, the gate electrodes arranged laterally with respect to the cathode region and forming an ohmic contact with the base layer;
forming a cathode electrode for each thyristor, the cathode electrodes arranged on the first main side of the semiconductor wafer, wherein the cathode electrodes of the first type thyristor cells form an ohmic contact with the cathode region and the cathode electrodes of the second type thyristor cells are insulated from the cathode region; and
forming an anode electrode for each thyristor, the anode electrodes arranged on the second main side and forming an ohmic contact with the anode layer;
wherein the cathode electrodes of the first type thyristor cells and second type thyristor cells are arranged in a segmented circular layout;
wherein the segmented circular layout comprises multiple concentric segment rings increasing in diameter from the center of the segmented circular layout;
wherein the cathode electrodes of the first type thyristor cells and second type thyristor cells are radially oriented and are circularly arranged within the concentric segment rings;
wherein a predefined percentage of second type thyristor cells of the overall amount of first type thyristor cells and second type thyristor cells in a segment ring is greater than 0% and less than or equal to 75%; and
wherein the segmented circular layout is configured so that, for the concentric segment rings, the predefined percentage decreases with increasing diameter.

14. The method of claim 13, further comprising:
forming a gate dielectric on the first main side of the semiconductor wafer; and
structuring the gate dielectric to form ohmic contacts of the gate electrodes with the base layer and to form ohmic contacts of the cathode electrode of the plurality of the first type thyristor cells with the cathode region, wherein the cathode electrodes of the second type thyristor cells are formed by not removing the gate dielectric for the cathode electrodes of the second type thyristor cells.

15. The method of claim 13, wherein the segmented circular layout comprises at least three concentric segment rings and wherein the predefined percentage is not equal for each of the concentric segment rings and forms a maximum somewhere between the innermost and the outermost concentric segment ring.

16. The method of claim 13, wherein the segmented circular layout is configured so that, for the concentric segment rings, the predefined percentage decreases monotonically with increasing diameter.

17. The method of claim 13, wherein the predefined percentage within each of the concentric segment rings is equally distributed in a circular direction.

18. The method of claim 13, further comprising forming a gate contact electrically contacting the gate electrodes, the gate contact being located radially outside of the concentric segment rings.

19. The method of claim 18, wherein the predefined percentage increases for the concentric segment rings with increasing diameter to a maximum amount and then the predefined percentage decreases for the concentric segment rings with increasing diameter.

20. The method of claim 13, further comprising forming a gate contact electrically contacting the gate electrodes, the gate contact being located in the center of the concentric segment rings.

* * * * *